United States Patent
Sinha et al.

(10) Patent No.: US 9,627,180 B2
(45) Date of Patent: Apr. 18, 2017

(54) METHOD FOR ION SOURCE COMPONENT CLEANING

(75) Inventors: Ashwini Sinha, Williamsville, NY (US); Serge Marius Campeau, Lancaster, NY (US); Lloyd Anthony Brown, East Amherst, NY (US)

(73) Assignee: PRAXAIR TECHNOLOGY, INC., Danbury, CT (US)

( * ) Notice: Subject to any disclaimer, the term of this patent is extended or adjusted under 35 U.S.C. 154(b) by 679 days.

(21) Appl. No.: 12/571,673

(22) Filed: Oct. 1, 2009

(65) Prior Publication Data

US 2011/0079241 A1 Apr. 7, 2011

(51) Int. Cl.
  *B08B 7/00* (2006.01)
  *B08B 9/00* (2006.01)
  (Continued)

(52) U.S. Cl.
  CPC .......... *H01J 37/3171* (2013.01); *C23C 14/48* (2013.01); *C23C 14/564* (2013.01);
  (Continued)

(58) Field of Classification Search
  CPC ................. H01J 37/08; H01J 2237/022; H01J 37/32412; H01J 37/32862; H01J 37/3171; C23C 14/48; C23C 14/564
  (Continued)

(56) References Cited

U.S. PATENT DOCUMENTS

| | | |
|---|---|---|
| 5,940,724 A | 8/1999 | Warren |
| 5,943,594 A | 8/1999 | Bailey et al. |

(Continued)

FOREIGN PATENT DOCUMENTS

| | | |
|---|---|---|
| CN | 101401191 A | 4/2007 |
| JP | H09251968 A | 9/1997 |

(Continued)

OTHER PUBLICATIONS

Yun et al. Effects of Various Additive Gases on Chemical Dry Etching Rate Enhancement of Low-k SiOCH Layer in $F_2$/Ar Remote Plasmas. Thin Solid Films 516 (2008) pp. 3549-3553.

(Continued)

*Primary Examiner* — Alexander Markoff
(74) *Attorney, Agent, or Firm* — Nilay S. Dalal (57) ABSTRACT

This invention relates in part to a method for cleaning an ion source component of an ion implanter used in semiconductor and microelectronic manufacturing. The ion source component includes an ionization chamber and one or more components contained within the ionization chamber. The interior of the ionization chamber and/or the one or more components contained within the ionization chamber have at least some deposits thereon of elements contained within a dopant gas, e.g., carborane ($C_2B_{10}H_{12}$). The method involves introducing a cleaning gas into the ionization chamber, and reacting the cleaning gas with the deposits under conditions sufficient to remove at least a portion of the deposits from the interior of the ionization chamber and/or from the one or more components contained within the ionization chamber. The cleaning gas is a mixture of $F_2$, one or more inert gases selected from noble gases and/or nitrogen, and optionally $O_2$, or a mixture of an oxygen/fluorine-containing gas and one or more inert gases selected from noble gases and/or nitrogen. The deposits adversely impact the normal operation of the ion implanter causing frequent down time and reducing tool utilization.

13 Claims, 5 Drawing Sheets

(51) Int. Cl.
*H01J 37/317* (2006.01)
*C23C 14/48* (2006.01)
*C23C 14/56* (2006.01)
*H01J 37/08* (2006.01)
*H01J 37/32* (2006.01)

(52) U.S. Cl.
CPC ........ *H01J 37/08* (2013.01); *H01J 37/32412* (2013.01); *H01J 37/32862* (2013.01); *H01J 2237/022* (2013.01)

(58) Field of Classification Search
USPC ............... 134/22.1, 22.18, 1, 1.1, 19, 21, 37
See application file for complete search history.

(56) References Cited

U.S. PATENT DOCUMENTS

| | | | |
|---|---|---|---|
| 6,110,838 A | | 8/2000 | Loewenstein |
| 6,135,128 A | * | 10/2000 | Graf et al. ...................... 134/1.1 |
| 6,221,169 B1 | * | 4/2001 | Bernstein et al. ................ 134/2 |
| 7,581,549 B2 | | 9/2009 | Johnson et al. |
| 2003/0056388 A1 | * | 3/2003 | Ohno et al. ........................ 34/72 |
| 2003/0122089 A1 | * | 7/2003 | Murrell et al. ........... 250/492.21 |
| 2005/0211923 A1 | * | 9/2005 | Banks ....................... 250/492.21 |
| 2006/0086376 A1 | * | 4/2006 | Dimeo et al. .................. 134/22.1 |
| 2007/0137671 A1 | * | 6/2007 | DiVergilio et al. ................ 134/1 |
| 2007/0210260 A1 | | 9/2007 | Horsky et al. |
| 2007/0241689 A1 | * | 10/2007 | Horsky et al. ............ 315/111.91 |
| 2008/0121811 A1 | * | 5/2008 | Horsky et al. ................. 250/424 |
| 2008/0223409 A1 | * | 9/2008 | Horsky et al. ............... 134/22.1 |
| 2009/0068844 A1 | | 3/2009 | Pischtiak et al. |
| 2009/0095713 A1 | * | 4/2009 | Dimeo et al. .................... 216/58 |
| 2009/0166554 A1 | | 7/2009 | Radovanov et al. |
| 2010/0022095 A1 | * | 1/2010 | Wu et al. ....................... 438/719 |
| 2010/0024841 A1 | * | 2/2010 | Koo et al. ....................... 134/1.1 |
| 2010/0025576 A1 | * | 2/2010 | Adams ............................ 250/288 |
| 2010/0107980 A1 | * | 5/2010 | Horsky et al. ............. 118/723 E |
| 2010/0154835 A1 | * | 6/2010 | Dimeo et al. .................... 134/31 |
| 2010/0155619 A1 | * | 6/2010 | Koo et al. ....................... 250/424 |
| 2010/0327159 A1 | * | 12/2010 | Platow et al. ................. 250/283 |

FOREIGN PATENT DOCUMENTS

| | | |
|---|---|---|
| JP | 2002100618 A | 4/2002 |
| JP | 2003178986 A | 6/2003 |
| WO | WO 03/054247 A2 | 7/2003 |
| WO | WO 2006047373 A2 * | 5/2006 |
| WO | WO 2007/127865 A2 | 11/2007 |
| WO | WO2007/146904 A2 | 12/2007 |
| WO | WO2008/012665 A1 | 1/2008 |
| WO | WO2009054966 A1 | 4/2009 |

OTHER PUBLICATIONS

Renau, A, "A Better Approach to Molecular Implantation", *Junction Technology, 2007 International Workshop on, IEEE, PI*, Jun. 1, 2007, pp. 107-112.

Ibbotson, et al. "Comparison of XeF2 and Fatom Reactions With Si and SiO2". Applied Physics Letters, vol. 44, No. 12, (Jun. 15, 1984) pp. 1129-1131.

Yun, et al. "Effects of Various Additive Gases on Chemical Dry Etching Rate Enhancement of Low-k SiOCH Layer in $F_2$/Ar Remote Plasmas". Published by Elsevier, Thin Solid Films, 516 (2008) pp. 3549-3553.

* cited by examiner

METHOD FOR ION SOURCE COMPONENT CLEANING

FIELD OF THE INVENTION

This invention relates in part to a method for cleaning an ion source component of an ion implanter used in semiconductor and microelectronic manufacturing. The method involves removing deposits formed during dopant implantation using a cleaning gas mixture. The deposits adversely impact the normal operation of the ion implanter causing frequent down time and reducing tool utilization.

BACKGROUND OF THE INVENTION

Ion implantation is an important process in semiconductor/microelectronic manufacturing. The ion implantation process is used in integrated circuit fabrication to introduce dopant impurities into semiconductor wafers. The desired dopant impurities are introduced into semiconductor wafers to form doped regions at a desired depth. The dopant impurities are selected to bond with the semiconductor wafer material to create electrical carriers and thereby alter the electrical conductivity of the semiconductor wafer material. The concentration of dopant impurities introduced determines the electrical conductivity of the doped region. Many such impurity regions are necessarily created to form transistor structures, isolation structures and other electronic structures, which collectively function as a semiconductor device.

In an ion implantation process, a gas material is used that contains the desired dopant element. The gas is introduced into an ion source chamber, i.e., ionization chamber, and energy is introduced into the chamber to ionize the gas. The ionization creates ions that contain the dopant element. The ions are extracted from the ion source chamber in the form of an ion beam of desired energy. Extraction can be carried out by applying a high voltage across extraction electrodes. When high purity is desired, the beam is transported through mass analyzer/filter to select the species to be implanted. The ion beam can then be accelerated/decelerated and transported to the surface of a semiconductor wafer for implantation of the dopant element into the semiconductor wafer. The ions of the beam penetrate the surface of the semiconductor wafer to form a region of desired electrical conductivity.

A problem with the ion implantation process involves deposition of gas material residues on the surfaces of the ion source chamber and components contained within the ion source chamber. This can result in accumulated residue deposits that interfere with the successful operation of the ion source chamber, for example, electrical short circuits caused from residue deposits formed on low voltage insulators in the ion source chamber and energetic high voltage sparking caused from residue deposits formed on insulators in the ion source chamber. The residue deposits can adversely impact the normal operation of the ion implanter, cause frequent downtime and reduce tool utilization. Safety issues can also arise due to the emission of toxic or corrosive vapors when the ion source chamber and components contained within the ion source chamber are removed for cleaning. It is therefore necessary to remove the accumulated deposit formations from the surfaces of the ion source chamber and components contained within the ion source chamber to minimize any interference with the successful operation of the ion source chamber.

Therefore, a need exists for removing the accumulated deposit formations from the surfaces of the ion source chamber and components contained within the ion source chamber. It would be desirable in the art to develop cleaning methods for removing the accumulated deposit formations from the surfaces of the ion source chamber and components contained within the ion source chamber so as to minimize any interference with the successful operation of the ion source chamber.

SUMMARY OF THE INVENTION

This invention relates in part to a method for cleaning an ion source component of an ion implanter, wherein said ion source component comprises an ionization chamber and one or more components contained within said ionization chamber, and wherein the interior of said ionization chamber and/or said one or more components contained within said ionization chamber have at least some deposits thereon of elements contained within a dopant gas, said method comprising:

introducing into said ionization chamber a cleaning gas, said cleaning gas comprising a mixture of $F_2$, one or more inert gases selected from noble gases and/or nitrogen, and optionally $O_2$, or a mixture of an oxygen/fluorine-containing gas and one or more inert gases selected from noble gases and/or nitrogen; and reacting said cleaning gas with said deposits under conditions sufficient to remove at least a portion of the deposits from the interior of said ionization chamber and/or from said one or more components contained within said ionization chamber.

This invention also relates in part to a method for cleaning an ion source component of an ion implanter, wherein said ion source component comprises an ionization chamber and one or more components contained within said ionization chamber, and wherein the interior of said ionization chamber and/or said one or more components contained within said ionization chamber have at least some deposits thereon of elements contained within carborane ($C_2B_{10}H_{12}$) dopant gas, said method comprising:

introducing into said ionization chamber a cleaning gas, said cleaning gas comprising a mixture of $F_2$, one or more inert gases selected from noble gases and/or nitrogen, and optionally $O_2$, or a mixture of an oxygen/fluorine-containing gas and one or more inert gases selected from noble gases and/or nitrogen; and reacting said cleaning gas with said deposits under conditions sufficient to remove at least a portion of the deposits from the interior of said ionization chamber and/or from said one or more components contained within said ionization chamber.

This invention further relates in part to a method for preventing or reducing the formation of deposits of elements contained within a dopant gas in an ion source component of an ion implanter, wherein said ion source component comprises an ionization chamber and one or more components contained within said ionization chamber, said method comprising:

introducing into said ionization chamber a dopant gas;

introducing into said ionization chamber a cleaning gas, said cleaning gas comprising a mixture of $F_2$, one or more inert gases selected from noble gases and/or nitrogen, and optionally $O_2$, or a mixture of an oxygen/fluorine-containing gas and one or more inert gases selected from noble gases and/or nitrogen; and reacting said dopant gas and said cleaning gas under conditions sufficient to prevent the formation of deposits on the interior of said ionization chamber and/or on said one or more components contained within said ionization chamber; or reacting said dopant gas, and deposits forming on the interior of said ionization chamber and/or on said one or more components contained within said ionization chamber during ionization of said dopant gas, with said cleaning gas under conditions sufficient to reduce the formation of deposits on the interior of said ionization chamber and/or on said one or more components contained within said ionization chamber.

This invention yet further relates in part to a method for preventing or reducing the formation of deposits of elements contained within carborane ($C_2B_{10}H_{12}$) dopant gas in an ion source component of an ion implanter, wherein said ion source component comprises an ionization chamber and one or more components contained within said ionization chamber, said method comprising:

introducing into said ionization chamber a dopant gas, said dopant gas comprising carborane ($C_2B_{10}H_{12}$);

introducing into said ionization chamber a cleaning gas, said cleaning gas comprising a mixture of $F_2$, one or more inert gases selected from noble gases and/or nitrogen, and optionally $O_2$, or a mixture of an oxygen/fluorine-containing gas and one or more inert gases selected from noble gases and/or nitrogen; and reacting said dopant gas and said cleaning gas under conditions sufficient to prevent the formation of deposits on the interior of said ionization chamber and/or on said one or more components contained within said ionization chamber; or reacting said dopant gas, and deposits forming on the interior of said ionization chamber and/or on said one or more components contained within said ionization chamber during ionization of said dopant gas, with said cleaning gas under conditions sufficient to reduce the formation of deposits on the interior of said ionization chamber and/or on said one or more components contained within said ionization chamber.

The method of this invention provides higher removal rates than other known processes such as $NF_3$ based processes for residue deposits formed during carborane implantation. The implementation of the method of this invention can enable customers to perform the desired cleaning operation faster and hence improve tool utilization. For example, users can gain an additional 1 hour of tool utilization per day by replacing $NF_3$ based cleaning with $F_2/Ar/O_2$ based cleaning process for carborane deposit removal in accordance with this invention. Faster cleaning operation can also result in less usage of cleaning gas and hence less frequent gas cylinder replacements. Thus, the users can further reduce tool downtime and safety concerns experienced during gas cylinder replacement.

DETAILED DESCRIPTION OF THE INVENTION

Figure 1:
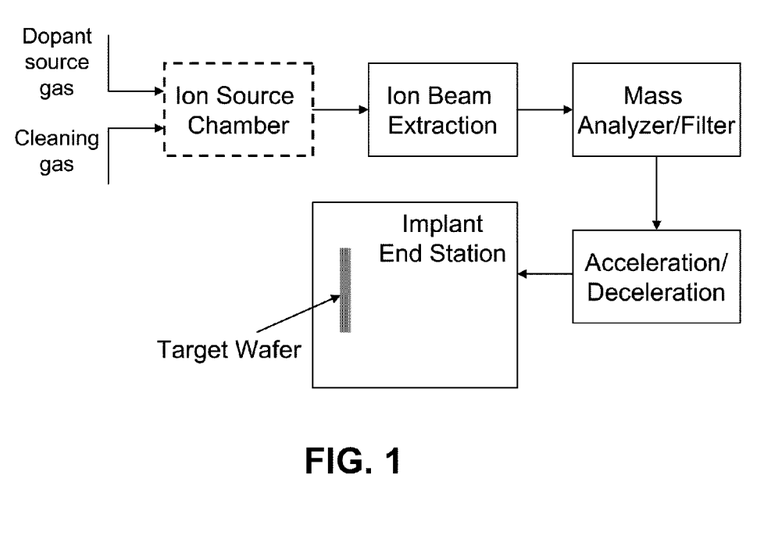
FIG. 1 is a schematic representation of an ion implant system.

A layer of deposits is formed on the walls and other components of an ion source chamber while performing ion implant process. The deposits are at least in part elements contained within a dopant gas, for example, vaporized carborane ($C_2B_{10}H_{12}$). The dopant gas may be obtained from a solid source, for example, carborane ($C_2B_{10}H_{12}$) is a solid source that is vaporized by heating. These deposits adversely impact the normal operation of the ion-implanter, cause frequent downtime and reduce tool utilization. FIG. 1 shows a schematic representation of an ion implant system. Deposits are formed on the walls and components of the ion source chamber shown as dashed box and the cleaning method of this invention removes deposits from those regions.

As indicated above, this invention relates in part to a method for cleaning an ion source component of an ion implanter, wherein said ion source component comprises an ionization chamber and one or more components contained within said ionization chamber, and wherein the interior of said ionization chamber and/or said one or more components contained within said ionization chamber have at least some deposits thereon of elements contained within a dopant gas, said method comprising:

introducing into said ionization chamber a cleaning gas, said cleaning gas comprising a mixture of $F_2$, one or more inert gases selected from noble gases and/or nitrogen, and optionally $O_2$, or a mixture of an oxygen/fluorine-containing gas and one or more inert gases selected from noble gases and/or nitrogen; and reacting said cleaning gas with said deposits under conditions sufficient to remove at least a portion of the deposits from the interior of said ionization chamber and/or from said one or more components contained within said ionization chamber.

The method of this invention provides a cleaning chemistry and process to remove the deposits formed during implantation, particularly carborane ($C_2B_{10}H_{12}$) implantation. The method of this invention involves use of a cleaning gas mixture containing $F_2$, one or more inert gases selected from noble gases (He, Ar, Xe and Kr) and/or nitrogen, and optionally $O_2$ to remove deposits of elements contained within a dopant gas. In a preferred embodiment, the cleaning gas comprises a mixture of $F_2$ and Ar, or a mixture of $F_2$, Ar and $O_2$.

The composition of the cleaning gas mixture includes $F_2/[Ar+F_2]$ mole ratio from about 0.1 to about 0.3. The composition of the cleaning gas mixture includes $O_2/[F_2+O_2]$ mole ratio from about 0.01 to about 0.6. A preferred gas mixture composition includes $F_2/[Ar+F_2]$ mole ratio from about 0.15 to about 0.25 and $O_2/[F_2+O_2]$ mole ratio from about 0.25 to about 0.45. In a preferred embodiment, adding $O_2$ to the $F_2$ and Ar gas mixture can enhance deposit removal rate by about 30-40% under optimized conditions. In another embodiment, instead of using $O_2$ and $F_2$ as separate gases, oxygen/fluorine-containing gases such as oxygen difluoride ($OF_2$) mixed with Ar can also serve as a cleaning gas.

The cleaning gas composition is preferably a $F_2/O_2/Ar$ mixture. At extreme points, i.e., $F_2/[Ar+F_2]=0.3$ and $O_2/[O_2+F_2]=0.6$, 1 mol of gas mixture will contain 0.21, 0.31 and 0.48 moles $F_2$, $O_2$ and Ar respectively. A dilute mixture of 10-25% $OF_2$ and balance Ar can also serve as a useful cleaning gas mixture. The cleaning gas should have higher reactivity with the deposits compared to the materials of construction of the ionization chamber and components contained within the ionization chamber.

Figure 2:
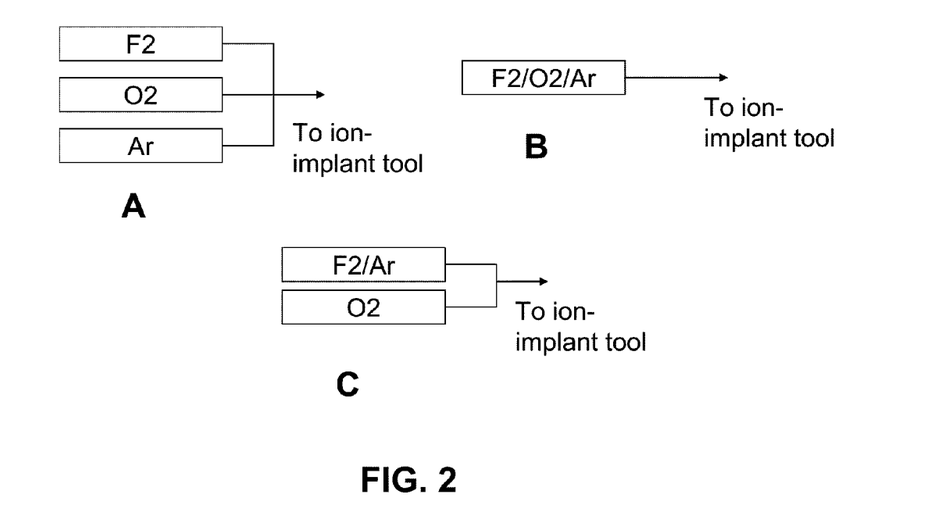
FIG. 2 is a schematic representation of different gas connection modes useful in this invention.

The individual gases can either be fed separately or in a premixed form. The gases can be plumbed to the source chamber separately or supplied in a premixed form. Various gas connection modes are suitable for use in the method of this invention. For example, $F_2$, Ar and $O_2$ from separate sources can be mixed and the mixture introduced into the ionization chamber. Alternatively, $F_2$ and Ar from one source and $O_2$ from a separate source can be mixed and the mixture introduced into the ionization chamber. Also, $F_2$, Ar and $O_2$ from one source can be introduced into the ionization chamber. See, for example, FIG. 2 that depicts different gas connection modes.

Illustrative dopant sources include, but are not limited to, carborane ($C_2B_{10}H_{12}$). The deposits formed during carborane implantation contain B, C and W in varying quantities depending upon the location in the process chamber. Other illustrative elements of which the dopant gas is comprised include phosphorus (P) and arsenic (As). Other illustrative dopant gases include, for example, phosphine ($PH_3$), arsine ($AsH_3$), germane ($GeH_4$), germanium tetrafluoride ($GeF_4$), and diborane ($B_2H_6$). The deposits formed during the implantation process using these other illustrative dopant sources may contain P, As, Ge and B respectively. The deposits formed in the ion source chamber can be removed by bringing them in contact with a mixture of $F_2$, Ar and optionally $O_2$ under desired process conditions. The deposits react with $F_2$, $O_2$, F radical, O radical and OxFy radical once exposed to the cleaning gas under desired operating conditions and are removed as volatile products. Ar serves as a carrier gas and also reduces recombination reactions responsible for the loss of active species. Ar is the preferred carrier gas compared to other noble gases such as He and Ne due to lower ionization potential of Ar compared to He and Ne. Also lower cost of Ar makes it a preferred candidate compared to Kr, Xe and Rn. $N_2$ has very similar cost structure and ionization potential compared to Ar. However, a lower etch rate results for W using $Ar/F_2$ than $N_2/F_2$ making Ar preferable to $N_2$ as a carrier gas. W is a common material of construction for ionization chambers and for components contained within the ionization chambers.

The method of this invention can employ thermal and/or plasma based activation to achieve the desired cleaning action. Cleaning gases can either be remotely activated by plasma and the active species transported to the source chamber or plasma can be generated in-situ in the source chamber. The preferred mode uses a combination of thermal and plasma activation. Reaction temperature during the cleaning process can range from about 25° C. to about 1000° C. Preferably, the temperature of the ionization chamber can range from about 200° C. to about 1000° C. Reaction pressure during the cleaning process can range from about 0.1 torr to about 10 torr. Preferably, the pressure in the ionization chamber can range from about 0.1 torr to about 1 torr.

Figure 3:
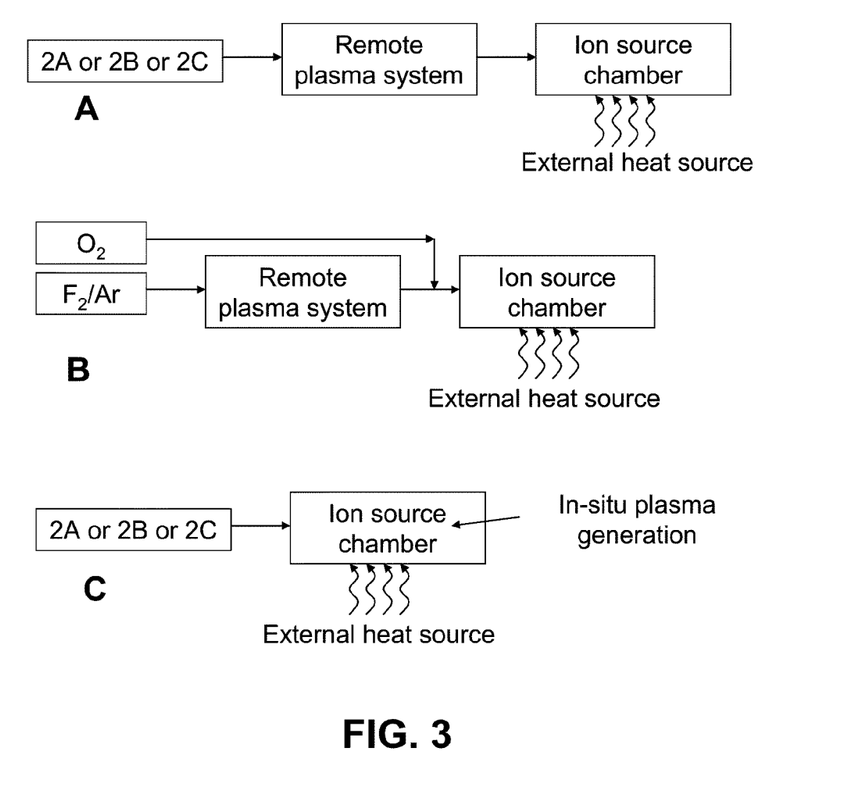
FIG. 3 is a schematic representation of different plasma and thermal activation modes useful in this invention.

The cleaning gases are subjected to thermal, plasma or a combination of both to produce active radicals/ions. See, for example, FIG. 3 that depicts different plasma and thermal activation modes. In an embodiment of this invention, introducing plasma activation in addition to thermal activation can significantly enhance the removal rate, for example, about a 3× improvement. Thermal activation can be provided by maintaining the ion source chamber, or at least a part of the ion source chamber, at a desired temperature. The gases can be subjected to plasma activation using a remote plasma system, for example, the remote plasma modes of FIGS. 3A and 3B, and then transporting the radicals/ions to the source chamber.

Prior to introducing the cleaning gas into the ionization chamber, the cleaning gas can be introduced into a plasma chamber. The cleaning gas is excited in the plasma chamber to create a plasma. The ions, radicals, neutrals and other disassociated species from the plasma are then introduced into the ionization chamber. See, for example, FIG. 3A.

Prior to introducing said cleaning gas into the ionization chamber, the cleaning gas comprising $F_2/Ar$ can be introduced into a plasma chamber. The cleaning gas is excited in the plasma chamber to create a plasma. The ions, radicals, neutrals and other disassociated species from the plasma are removed from said plasma chamber and mixed with $O_2$ to create a gas stream. The gas stream is then introduced into the ionization chamber. See, for example, FIG. 3B.

Alternatively, plasma can be generated in-situ, for example, the direct plasma mode of FIG. 3C, in the source chamber. In a preferred embodiment, plasma is generated in-situ in the ion source chamber, which can easily be achieved by providing desired potential across the cathode and anti-cathode in the source chamber. Direct plasma mode has several potential advantages over remote plasma mode including (i) no loss of active radicals or ions in the flow lines, (ii) no need of additional remote plasma equipment, and (iii) in-situ plasma generation produces sufficient thermal energy to raise temperature of the ion source chamber wall to desired values required for thermal activation.

Reaction conditions for the reaction of the cleaning gas with the deposits, such as temperature, pressure and contact time, may also vary greatly. Any suitable combination of such conditions may be employed herein that are sufficient to remove at least a portion of the deposits from the interior of the ionization chamber and/or from the one or more components contained within the ionization chamber. The ionization chamber pressure during the cleaning process can range from about 0.1 to about 10 torr, preferably from about 0.1 to about 1.0 torr. The ionization chamber temperature during the cleaning process can range from about 25° C. to about 1000° C., preferably from about 400° C. to about 600° C. The reaction time of the cleaning gas with the deposits in the ionization chamber can range from about 30 seconds to about 45 minutes. The preferred reaction time varies depending on the frequency of cleaning that a user practices. The cleaning gas flow rate can range from about 10 to about 1000 sccm, preferably from about 50 to about 250 sccm.

Following the reaction of the cleaning gas with the deposits and removal of at least a portion of the deposits from the interior walls of the ionization chamber and/or from the one or more components contained within the ionization chamber, the deposits are removed from the ionization chamber as volatile products. The ionization chamber can then be evacuated and the cleaning process repeated as many times as needed. The evacuated volatile products can be directed to abatement units such as incinerators, wet/dry scrubbers, and the like.

As also indicated above, this invention also relates in part to a method for cleaning an ion source component of an ion implanter, wherein said ion source component comprises an ionization chamber and one or more components contained within said ionization chamber, and wherein the interior of said ionization chamber and/or said one or more components contained within said ionization chamber have at least some deposits thereon of elements contained within carborane ($C_2B_{10}H_{12}$) dopant gas, said method comprising:

introducing into said ionization chamber a cleaning gas, said cleaning gas comprising a mixture of $F_2$, one or more inert gases selected from noble gases and/or nitrogen, and optionally $O_2$, or a mixture of an oxygen/fluorine-containing gas and one or more inert gases selected from noble gases and/or nitrogen; and reacting said cleaning gas with said deposits under conditions sufficient to remove at least a portion of the deposits from the interior of said ionization chamber and/or from said one or more components contained within said ionization chamber.

The method of this invention is directed to cleaning the deposits after they are formed during the preceding implant process. In an alternative mode, the cleaning gas mix can be supplied continuously along with the dopant source gas while the implant process is in progress.

As indicated above, this invention relates in part to a method for preventing or reducing the formation of deposits of elements contained within a dopant gas in an ion source component of an ion implanter, wherein said ion source component comprises an ionization chamber and one or more components contained within said ionization chamber, said method comprising:

introducing into said ionization chamber a dopant gas;

introducing into said ionization chamber a cleaning gas, said cleaning gas comprising a mixture of $F_2$, one or more inert gases selected from noble gases and/or nitrogen, and optionally $O_2$, or a mixture of an oxygen/fluorine-containing gas and one or more inert gases selected from noble gases and/or nitrogen; and reacting said dopant gas and said cleaning gas under conditions sufficient to prevent the formation of deposits on the interior of said ionization chamber and/or on said one or more components contained within said ionization chamber; or reacting said dopant gas, and deposits forming on the interior of said ionization chamber and/or on said one or more components contained within said ionization chamber during ionization of said dopant gas, with said cleaning gas under conditions sufficient to reduce the formation of deposits on the interior of said ionization chamber and/or on said one or more components contained within said ionization chamber.

In particular, this invention relates in part to a method for preventing or reducing the formation of deposits of elements contained within carborane ($C_2B_{10}H_{12}$) dopant gas in an ion source component of an ion implanter, wherein said ion source component comprises an ionization chamber and one or more components contained within said ionization chamber, said method comprising:

introducing into said ionization chamber a dopant gas, said dopant gas comprising carborane ($C_2B_{10}H_{12}$);

introducing into said ionization chamber a cleaning gas, said cleaning gas comprising a mixture of $F_2$, one or more inert gases selected from noble gases and/or nitrogen, and optionally $O_2$, or a mixture of an oxygen/fluorine-containing gas and one or more inert gases selected from noble gases and/or nitrogen; and reacting said dopant gas and said cleaning gas under conditions sufficient to prevent the formation of deposits on the interior of said ionization chamber and/or on said one or more components contained within said ionization chamber; or reacting said dopant gas, and deposits forming on the interior of said ionization chamber and/or on said one or more components contained within said ionization chamber during ionization of said dopant gas, with said cleaning gas under conditions sufficient to reduce the formation of deposits on the interior of said ionization chamber and/or on said one or more components contained within said ionization chamber. The method further comprises extracting an ion beam from said ionization chamber for implantation into a substrate.

For the method of preventing or reducing the formation of deposits on the interior of the ionization chamber and/or on said one or more components contained within the ionization chamber, the composition of the cleaning gas mixture can be as described herein. This deposit prevention method is an in situ cleaning method and can be called a co-bleed mode of operation.

Reaction conditions for the reaction of the cleaning gas and the dopant gas, such as temperature, pressure and contact time, may also vary greatly. Any suitable combination of such conditions may be employed herein that are sufficient to prevent or reduce the formation of deposits from the interior of the ionization chamber and/or from the one or more components contained within the ionization chamber. The ratio of cleaning gas to dopant gas can range from about 0.1:1 to greater than about 3:1. The ionization chamber pressure can range from about 0.1 to about 5 millitorr, preferably from about 0.5 to about 2.5 millitorr. The ionization chamber temperature can range from about 25° C. to about 1000° C., preferably from about 400° C. to about 600° C. The cleaning gas flow rate and dopant gas flow rate are typically of a similar order of magnitude in the process. Preferably, the cleaning gas and dopant gas flow rates can range from about 0.1 to about 10 sccm, more preferably from about 0.5 to about 3 sccm.

In the operation of the co-bleed mode, the cleaning time is equal to the duration that the dopant and cleaning gases are flown. This duration then is dependent on the process time for the user. The cleaning time depends not only on the process recipe but also the number of wafers and fab loading. In the co-bleed mode of operation, the user may continue to flow the cleaning gas even after stopping the dopant gas to ensure removal of any deposits left.

The method of preventing or reducing the formation of deposits on the interior of the ionization chamber and/or on said one or more components contained within the ionization chamber employs thermal/plasma based activation as described herein. The dopant gas is ionized by striking plasma in the ionization chamber and the temperature of the ionization chamber wall and the components contained within the ionization chamber rises due to conduction and/or radiation from the heated cathode.

In thermal/plasma based activation, the plasma can comprise disassociated and ionized constituents of the dopant gas, i.e., carborane ($C_2B_{10}H_{12}$), and disassociated and ionized constituents of the cleaning gas, i.e., a mixture of $F_2$, Ar and optionally $O_2$. The disassociated and ionized constituents of the dopant gas react with the disassociated and ionized constituents of the cleaning gas to prevent or reduce formation of deposits of the elements contained within the ionizable dopant gas on the interior of the ionization chamber and/or on the one or more components contained within the ionization chamber. Mass flow controllers can be used to control the ratio of cleaning gas to dopant gas introduced into the ionization chamber. The ratio of cleaning gas to dopant gas can range from about 0.1:1 to greater than about 3:1.

Various modifications and variations of this invention will be obvious to a worker skilled in the art and it is to be understood that such modifications and variations are to be included within the purview of this application and the spirit and scope of the claims.

EXAMPLE 1

The performance of $NF_3$ cleaning gas with different variations of cleaning gas chemistry used in this invention was compared. Under similar processing conditions, $F_2$/Ar and $F_2$/Ar/$O_2$ mix demonstrated better removal rates than $NF_3$ (see Tables A and B below). For the thermally activated cleaning process, $F_2$/Ar/$O_2$ resulted in greater than 2× faster residue deposit removal rate even at lower temperature. Also, when operated under a combination of plasma and thermal activation, $F_2$/Ar/$O_2$ based chemistry exhibited better removal rates than $NF_3$ based chemistry. In addition, due to lower bond dissociation energy of F—F bonds in $F_2$ compared to N—F bonds in $NF_3$, less plasma power is required to sustain fully dissociated $F_2$ plasma in comparison to $NF_3$ plasma. Higher residue deposit removal rates in combination with low power requirements offer the user a wider process window to perform desired cleaning operation.

TABLE A

Activation Mode: Thermal

| Clean Gas | $O_2/F_2$ mol ratio | Pressure (Torr) | Temperature (° C.) | Removal Rate (μm/min/100 scc-F) |
|---|---|---|---|---|
| $NF_3$/Ar | NA | 3.0 | 800 | 0.7 |
| $F_2$/Ar/$O_2$ | 0.0 | 3.0 | 600 | 1.5 |

TABLE B

Activation Mode: Plasma + Thermal

| Clean Gas | $O_2/F_2$ mol ratio | Pressure (Torr) | Temperature (° C.) | Removal Rate (μm/min/100 scc-F) |
|---|---|---|---|---|
| $NF_3$/Ar | NA | 3.0 | 400 | 1.2 |
| $F_2$/Ar/$O_2$ | 0.0 | 3.0 | 400 | 1.6 |
| $F_2$/Ar/$O_2$ | 0.4 | 3.0 | 400 | 2.1 |

EXAMPLE 2

Figure 4:
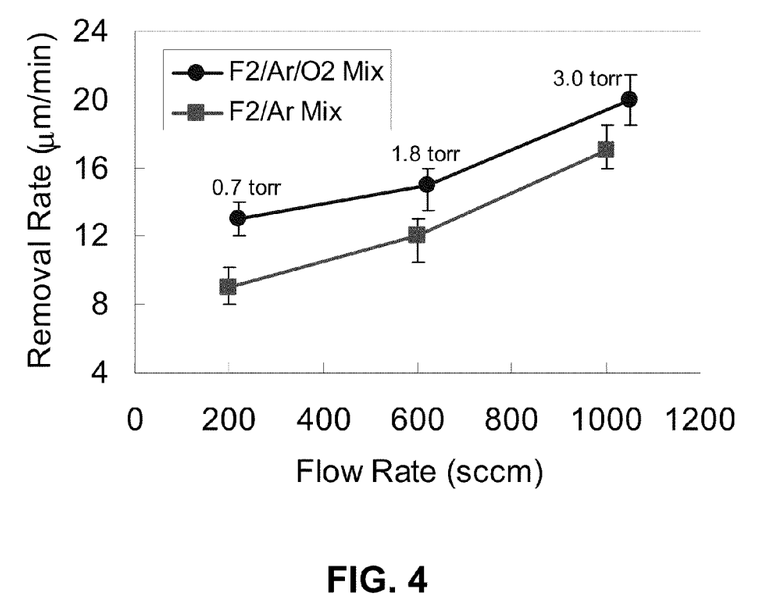
FIG. 4 graphically depicts the effect of cleaning gas flow and chamber pressure on removal rate.

Experiments were conducted to evaluate removal rate of deposits from carborane dopant gas at different operating conditions. FIG. 4 presents removal rate observed at different flow rates of $F_2$/$O_2$/Ar mix ($F_2$:$O_2$:Ar-0.18:0.09:0.73) and $F_2$/Ar mix ($F_2$:Ar-0.20:0.80). The mix compositions used in these experiments are:

$F_2$/$O_2$/Ar mix: $F_2$:$O_2$:Ar=0.18:0.09:0.73, i.e., $F_2$/[$F_2$+Ar]=0.20 and $O_2$/[$O_2$+$F_2$]=0.33

$F_2$/Ar mix: $F_2$:Ar=0.20:0.80, i.e. $F_2$/[$F_2$+Ar]=0.20

FIG. 4 depicts the effect of cleaning gas flow and chamber pressure on removal rate. Pressure values listed beside each data point is the chamber pressure during corresponding experiment. It is observed that for both $F_2$/Ar and $F_2$/$O_2$/Ar mix removal rate drops by only about 1.9× and about 1.6× respectively with an about 5× reduction in cleaning gas flow (and corresponding chamber pressure) thus indicating more efficient utilization of cleaning gas in low flow-low pressure mode. It is also desirable to maintain low pressure (less than 1.0 torr) in the ion source chamber when cleaning is performed in direct plasma mode due to the physical location of the generated plasma. At higher pressures, plasma will tend to localize around the cathode regions in the arc chamber unlike low pressure operation where plasma tends to spread around the chamber and hence provide more uniform cleaning. The results demonstrate that reasonably high removal rates are achievable using $F_2$/Ar/$O_2$ mix at about 200 sccm and a chamber pressure of 0.7 torr. Further optimization based on specific implanter configuration is also possible.

Figure 5:
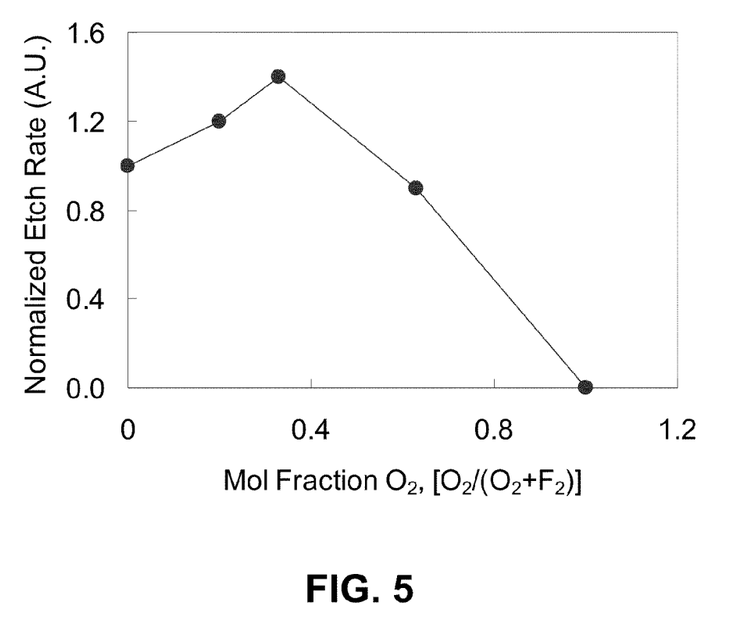
FIG. 5 graphically depicts the impact of oxygen addition on removal rate.

FIG. 5 illustrates the effect of oxygen addition on removal rate performance of the cleaning gas mix. Initially removal rate increased as the relative concentration of $O_2$ in the gas mix was increased, however an opposite effect was observed as $O_2$ concentration continued to increase. The removal rate dropped to zero when samples were subjected to a pure oxygen stream. The results suggested that the preferred range of $O_2$ mol fraction [moles $O_2$/(moles $O_2$+moles $F_2$)] in the cleaning gas mix is from about 0.3-0.5.

The invention claimed is:

1. A method for cleaning an ion source component of an ion implanter, wherein said ion source component comprises an ionization chamber and one or more components contained within said ionization chamber, and wherein the interior of said ionization chamber and/or said one or more components contained within said ionization chamber have at least some deposits thereon of elements contained within a dopant gas, said method comprising:
   introducing into said ionization chamber a cleaning gas, said cleaning gas comprising a mixture of $F_2$, Ar and O2 wherein the $F_2$/[Ar+$F_2$] mole ratio is from about 0.15 to about 0.25, and the $O_2$/[$F_2$+$O_2$] mole ratio is from about 0.25 to about 0.45; and
   reacting said cleaning gas with said deposits under conditions sufficient to remove at least a portion of the deposits from the interior of said ionization chamber and/or from said one or more components contained within said ionization chamber, wherein at least a portion of the deposits are boron-containing.

2. The method of claim 1, wherein $F_2$, Ar and $O_2$ from separate sources are mixed and said mixture introduced into said ionization chamber; $F_2$ and Ar from one source and $O_2$ from a separate source are mixed and said mixture introduced into said ionization chamber; or $F_2$, Ar and $O_2$ from one source are introduced into said ionization chamber.

3. The method of claim 1 wherein the dopant gas comprises carborane ($C_2B_{10}H_{12}$).

4. The method of claim 1 wherein the deposits comprise a compound having an element selected from B (boron), C (carbon), W (tungsten), and mixtures thereof.

5. The method of claim 1 wherein said method employs thermal and/or plasma based activation of said cleaning gas.

6. The method of claim 1 further comprising (i) prior to introducing said cleaning gas into said ionization chamber, introducing said cleaning gas into a plasma chamber, exciting said cleaning gas in said plasma chamber to create a plasma, and introducing ions, radicals, neutrals and other disassociated species from said plasma into said ionization chamber, (ii) introducing said cleaning gas into said ionization chamber and exciting said cleaning gas in said ionization chamber to create a plasma, or (iii) prior to introducing said cleaning gas into said ionization chamber, introducing said cleaning gas comprising $F_2$/Ar into a plasma chamber, exciting said cleaning gas in said plasma chamber to create a plasma, removing ions, radicals, neutrals and other disassociated species from the plasma from said plasma chamber, mixing said ions, radicals, neutrals and other disassociated species from the plasma with $O_2$ to create a gas stream, and introducing said gas stream into said ionization chamber.

7. The method of claim 1 wherein reacting said cleaning gas with said deposits is carried out in said ionization chamber at a temperature of from about 25° C. to about 1000° C.

8. The method of claim 1 wherein reacting said cleaning gas with said deposits is carried out in said ionization chamber at a pressure of from about 0.1 torr to about 10 torr.

9. The method of claim 1 wherein reacting said cleaning gas with said deposits is carried out in said ionization chamber at a reaction time of from about 30 seconds to about 45 minutes.

10. The method of claim 1 wherein said cleaning gas is introduced into said ionization chamber at a flow rate of from about 10 sccm to about 1000 sccm.

11. The method of claim 1 further comprising evacuating said ionization chamber after said reacting.

12. The method of claim 11 further comprising repeating said method one or more times.

13. A method for cleaning an ion source component of an ion implanter, wherein said ion source component comprises an ionization chamber and one or more components contained within said ionization chamber, and wherein the interior of said ionization chamber and/or said one or more components contained within said ionization chamber have at least some deposits formed during ion implantation of carborane ($C_2B_{10}H_{12}$) dopant gas, said method comprising:

introducing into said ionization chamber a cleaning gas, said cleaning gas comprising a mixture of $F_2$, Ar and O2 wherein the $F_2/[Ar+F_2]$ mole ratio is from about 0.15 to about 0.25, and the $O_2/[F_2+O_2]$ mole ratio is from about 0.25 to about 0.45; and reacting said cleaning gas with said deposits under conditions sufficient to remove at least a portion of the deposits from the interior of said ionization chamber and/or from said one or more components contained within said ionization chamber, wherein at least a portion of said deposits are boron-containing.

* * * * *